(12) United States Patent
Krivokapic et al.

(10) Patent No.: US 6,238,982 B1
(45) Date of Patent: *May 29, 2001

(54) MULTIPLE THRESHOLD VOLTAGE SEMICONDUCTOR DEVICE FABRICATION TECHNOLOGY

(75) Inventors: Zoran Krivokapic, Santa Clara; Ognjen Milic, Burlingame, both of CA (US)

(73) Assignee: Advanced Micro Devices, Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/289,909

(22) Filed: Apr. 13, 1999

(51) Int. Cl.[7] .................. H01L 21/8234; H01L 21/00; H01L 21/338; H01L 21/337; H01L 21/336
(52) U.S. Cl. .................. 438/275; 438/163; 438/174; 438/194; 438/289
(58) Field of Search .................. 438/275, 289, 438/290, 294, 296, 301, 302, 303, 276, 277, 278, 291, 163, 174, 194

(56) References Cited

U.S. PATENT DOCUMENTS

| | | | |
|---|---|---|---|
| 4,963,501 | * 10/1990 | Ryan et al. | 437/40 |
| 5,273,926 | * 12/1993 | Tigelaar | 437/52 |
| 5,629,548 | * 5/1997 | Tamaki et al. | 257/400 |
| 5,795,803 | * 8/1998 | Takamura et al. | 438/228 |
| 5,847,432 | * 12/1998 | Nozaki | 257/369 |
| 5,858,827 | * 1/1999 | Ono | 438/232 |
| 5,895,954 | * 4/1999 | Yasumura et al. | 257/345 |
| 5,970,331 | * 10/1999 | Gardner et al. | 438/199 |
| 5,990,516 | * 11/1999 | Momose et al. | 257/327 |
| 6,077,736 | * 6/2000 | Hwang et al. | 438/231 |

OTHER PUBLICATIONS

Matsuki et al., "Laterally–Doped Channel (LDC) Structure for Sub–Quarter Micron MOSFETs", VLSI Technology, 1991. Digest of Technical Papers Symposium, pp. 113–114, May 28–30, 1991.*

C.H. Diaz et al., A 0.18um CMOS Logic Technology with Dual Gate Oxide and . . . , TSMC, Taiwan ROC, VLSI Tech. Symposium 1999.

* cited by examiner

Primary Examiner—Matthew Smith
Assistant Examiner—Lex H. Malsawma
(74) Attorney, Agent, or Firm—Eugene H. Valet

(57) ABSTRACT

An integrated circuit process technology for simultaneously forming multiple threshold voltage devices is disclosed. Devices having both high speed and low power consumption can be fabricated for use in integrated circuits having a need for both, such as microprocessors having cache memory.

13 Claims, 6 Drawing Sheets

MULTIPLE THRESHOLD VOLTAGE SEMICONDUCTOR DEVICE FABRICATION TECHNOLOGY

BACKGROUND OF THE INVENTION

1. Field of the Invention

The present invention relates generally to integrated circuits and their fabrication processes. More specifically, the present invention relates to an integrated circuit fabrication process for making multi-threshold-voltage,"Vt," integrated circuits and the devices fabricated with the process.

2. Description of Related Art

A common integrated circuit transistor device is the Metal Oxide Semiconductor Field Effect Transistor, or "MOSFET." A typical MOSFET structure includes a pair of source/drain regions implanted into a surface of a silicon substrate, a gate oxide thin film formed on the substrate between the source/drain regions, and a gate electrode structure formed on the surface of the gate oxide. The region of the substrate itself between the source/drain regions is known as the channel region. The length of the channel region, "Lc," is the distance between the source/drain regions. Typically, the channel length is less than the gate length, "Lg," measured in the same dimension.

The threshold voltage, Vt, for a MOSFET device is defined as the applied gate-to-source voltage, "Vgs," below which the MOSFET device drain-to-source current, "Ids," becomes effectively zero (although a drain-to-source leakage current may still be present, it is considered negligible). The threshold voltage, Vt, is a function of a number of parameters, including gate material, gate insulation material and thickness, channel doping levels, impurity levels, source-to-substrate voltage, and the like as would be known to a person skilled in the art.

A prior art process is shown in FIGS. 1a–1f. FIG. 1a depicts a silicon substrate material 10 that has a first conductivity type (e.g., for NMOS, having boron or $BF_2$ impurities; for PMOS having arsenic or phosphorous impurities, at a first concentration level). A threshold adjust implant, represented by arrows 12, forms a substrate surface layer 10a having a higher, second concentration of first conductivity type impurities. Typically, the impurity doping is at an injection energy of about 5-to-15 KeV at a concentration of about $8 \times 10^{12}$ ions/cm$^2$. As shown in FIG. 1b, a gate oxide 14 is grown on the substrate surface region 10a. Next, as illustrated by FIG. 1c, a gate electrode 16 structure, comprising a pillar of polysilicon is deposited on the gate oxide 14 and etched. Thereafter, as shown in FIG. 1d, lightly-doped source/drain ("LDD") regions 18 are implanted with second conductivity type impurities, represented by arrows 19, at self-aligning positions with respect to the gate electrode 16 structure. For an exemplary NMOS device, arsenic ions are typically implanted at a concentration range of about $1 \times 10^{14}$ to $1 \times 10^{15}$ ions/cm$^2$ at about 5 KeV. Looking to FIG. 1e, sidewall spacers 20, serving as insulating films, are formed by deposition and etching to each side of the gate electrode 16 pillar. Finally, as depicted in FIG. 1f, higher-doped source/drain regions 22 are implanted, represented by arrows 23, self-aligning to the spacers 20 between the LDD regions 18 and the Vt adjust implant surface layer 10a. For the exemplary NMOS device, arsenic ions are implanted at a concentration of about $2 \times 10^{15}$ ions/cm$^2$ at about 5-to-10 KeV injection energy.

There is considerable technology developed for the manipulation of threshold voltage, Vt, referred to in the art as "Vt adjusts." See e.g.: *A Novel Source-to-Drain Nonuniformly Doped Channel MOSFET for High Current Drivability and Threshold Voltage Controllability*, Okamura et al., IDEM 90, pp. 391–394; or, U.S. Pat. No. 5,466,957, Yuki et al.; or, assignee's own U.S. patent application Ser. No. 08/949,959, Milec-Strakalj & Yeap, for A MOS Device with Self-Compensating Vt-Implants, and assignee's own U.S. patent application Ser. No. 08/914,986, Krivokapic, for a Self-Aligned Channel Transistor and Method for Making Same.

In certain types of integrated circuit devices, for example microprocessors having a cache memory, there is a need for transistors performing both high speed logic and low power consumption which is generally measured by the OFF-state leakage current (a function of gate length). The same transistor can not achieve both; a shorter gate length will inherently have a higher leakage current. One solution has been the use of semiconductor device structures having two different Vt adjust implants. This is a relatively costly process. As shown in FIGS. 2a–2c, it requires multiple Vt adjust implant steps to form devices with different Vt characteristics.

Another solution is the use of the use of two different gate oxide thicknesses. See e.g., *A 0.18 um CMOS Logic Technology with Dual Gate Oxide and Low-k Interconnect for High-Performance and Low-Power Applications*, Diaz et al., VLSI Technology Symposium 1999 report, proposing the support of 1.5-to-2 volt core logic as well as 3.3 volt periphery circuitry (input/output). As shown in FIGS. 3a–3c, it requires multiple etch steps. This is a relatively complex and more costly process.

Another solution is provided in accordance with the present invention.

SUMMARY OF THE INVENTION

In its basic aspects, the present invention provides an integrated circuit fabrication process for making multi-threshold voltage (Vt,) circuit devices. The process includes the steps of: forming a gate oxide layer on a semiconductor substrate; forming a plurality of gate pillars having a plurality of gate length dimensions, $Lg_n$, on the gate oxide layer such that a respective plurality of subjacent channel regions having corresponding channel lengths, $Lc_n$, are formed in the substrate subjacent the gate pillars; and forming dopant implant regions in each of the subjacent channel regions and on first and second sides of the channel regions at each of the plurality of gate pillars respectively such that each combination of a dopant implant region, a channel region and a superjacent gate pillar thereof forms a semiconductor device having a characteristic threshold voltage, Vt, determined by a respective channel length thereof.

In another basic aspect, the present invention provides a method for fabrication of an integrated circuits such that each single integrated circuit has MOSFET devices having differing threshold voltage characteristics, including the steps of: providing a semiconductor substrate having an epitaxial layer; forming device isolation regions in the epitaxial layer; forming a gate oxide layer on the epitaxial layer; forming a plurality of MOSFET devices by forming a plurality of gate pillars on the gate oxide layer, wherein each of the gate pillars has a characteristic gate length dimension, $Lg_n$, such that a respective plurality of subjacent channel regions having corresponding channel lengths, $Lc_n$, are formed in the substrate subjacent the gate pillars, and wherein n≧2, and forming dopant implant regions in the subjacent channel regions and on first and second sides of the channel regions at each of the plurality of gate pillars respectively such that each combination of a source/drain region, a channel region and superjacent gate pillar thereof forms a semiconductor device having a threshold voltage, $Vt_n$, determined by the respective channel length therein.

In another basic aspect, the present invention provides an integrated circuit having a plurality of MOSFET devices, each of the MOSFET devices having a characteristic threshold voltage (Vt). The circuit includes: a semiconductor substrate; at least one of a first MOSFET device having a first gate stack including a first gate oxide layer on the semiconductor substrate, a polysilicon or amorphous silicon first gate pillar, having a first gate length dimension, $Lg_1$, and a first gate electrode atop the first gate pillar, and a respective first channel region subjacent the first gate stack having a first channel length, $Lc_1$, in the substrate subjacent the first gate stack, and first dopant implant regions in the first channel region and on first and second sides of the first channel region respectively forming a first MOSFET device having a threshold voltage, $Vt_1$, determined by the respective first channel length therein; and at least one of a second MOSFET device having a second gate stack including a second gate oxide layer on the semiconductor substrate, a polysilicon or amorphous silicon second gate pillar, having a second gate length dimension, $Lg_2$, where $Lg_2$ is greater than $Lg_1$, and a second gate electrode atop the second gate pillar, and a respective second channel region subjacent the second gate stack having a second channel length, $Lc_1$, where $Lc_2$ is greater than $Lc_1$, in the substrate subjacent the second gate stack, and second dopant implant regions in the second channel region and on first and second sides of the second channel region respectively forming a second MOSFET device having a threshold voltage, $Vt_2$, determined by the respective second channel length therein, wherein the first MOSFET device is a high speed MOSFET device and the second MOSFET device is a low power consumption MOSFET device.

It is an advantage of the present invention that it reduces power consumption (OFF-state leakage).

It is an advantage of the present invention that it reduces the size of silicon area required for cache memory.

It is another advantage of the present invention that the simplification of process results in a better die yield.

Other objects, features and advantages of the present invention will become apparent upon consideration of the following explanation and the accompanying drawings, in which like reference designations represent like features throughout the drawings.

The drawings referred to in this specification should be understood as not being drawn to scale except if specifically noted.

DESCRIPTION OF THE PREFERRED EMBODIMENT

Reference is made now in detail to a specific embodiment of the present invention, which illustrates the best mode presently contemplated by the inventors for practicing the invention. Alternative embodiments are also briefly described as applicable. It should be recognized that many publications describe the details of common techniques used in the fabrication process of integrated circuit components. See, e.g., Wolf, S., *Silicon Processing for the VLSI Era*, copyright 1990, Lattice Press; Sze, S. M., *VLSI Technology*, copyright 1988, McGraw-Hill; Ghandhi, S. K., *VLSI Fabrication Principles*, copyright 1983, John Wiley & Sons; or *Semiconductor & Integrated Circuit Fabrication Techniques*, Reston Publishing Co., Inc., copyright 1979 by the Fairchild Corporation. Those known manner techniques are generally employed in the fabrication of the structure of the present invention except in the steps required to accomplish the goals of the present invention; as such, an in depth description of known manner steps is unnecessary to an understanding of the present invention. Moreover, the individual steps of such a process can be performed using commercially available integrated circuit fabrication machines. See, e.g., Chapman, B., *Glow Discharge Processes/Sputtering and Plasma Etching*, copyright 1980, John Wiley & Sons. As specifically helpful to an understanding of the present invention, approximate technical data are set forth based upon current technology. Future developments in this art may call for appropriate adjustments as would be obvious to one skilled in the art.

It will be intuitively obvious to a person skilled in the art that the invention taught herein will have wide to applicability to integrated circuit fabrication processes; this description relies on an exemplary implementation of industrial applicability and no limitation on the scope of the invention is intended nor should any be implied therefrom.

It has been found that no Vt adjust implant nor formation of different thickness gate oxide layers is required in the formation of MOSFET devices to achieve the goal of faster device and smaller leakage current in integrated circuits incorporating multiple Vt devices.

Figure 1A:
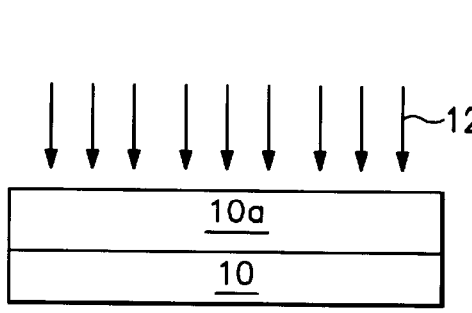
FIGS. 1a through 1f are sequential depictions of a PRIOR ART MOSFET fabrication process showing typical Vt adjusts.
Figure 1B:
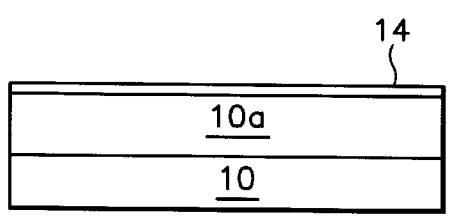
Figure 1C:
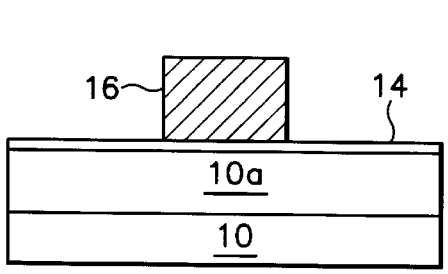
Figure 1D:
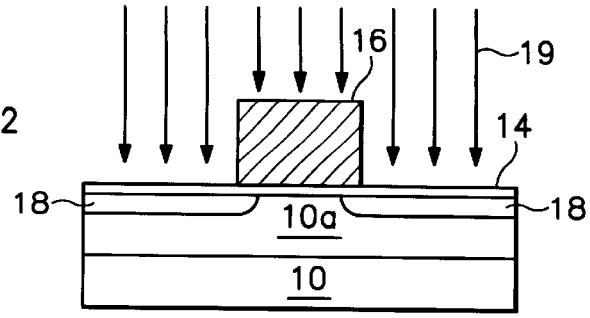
Figure 1E:
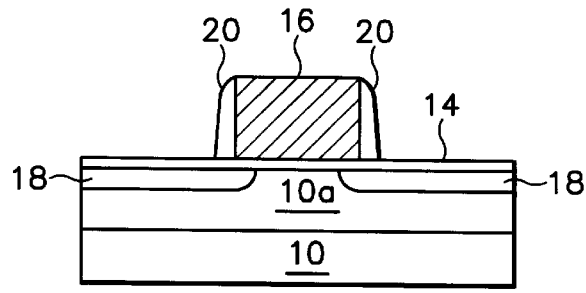
Figure 1F:
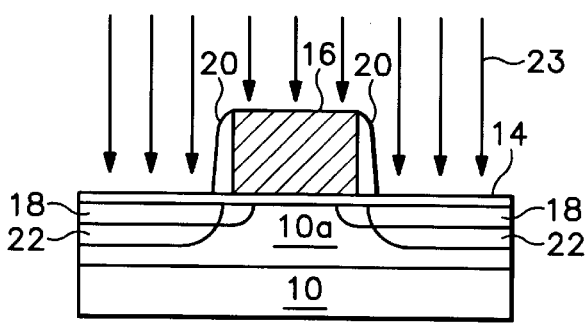
Figure 2A:
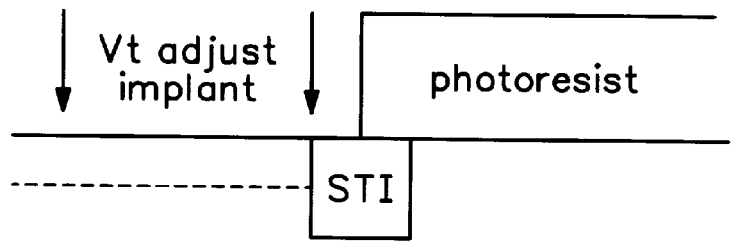
FIGS. 2a through 2c are sequential depictions of a PRIOR ART MOSFET fabrication process showing multiple Vt adjust implant steps to achieve dual Vt performance capability.
Figure 2B:
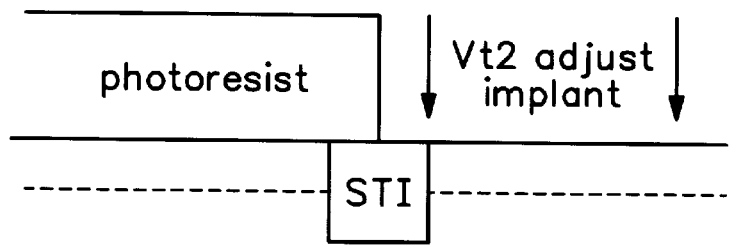
Figure 2C:
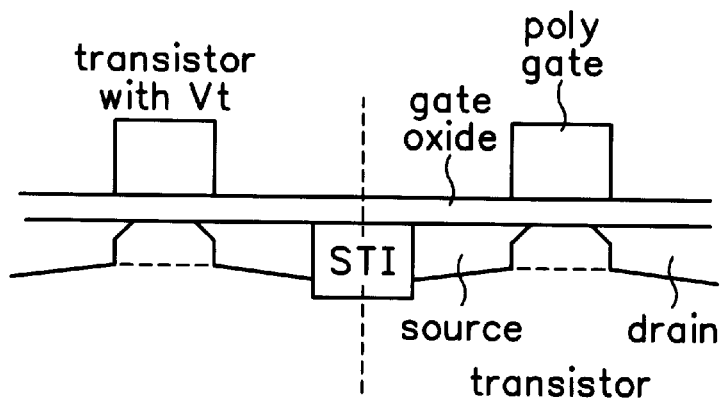
Figure 3A:
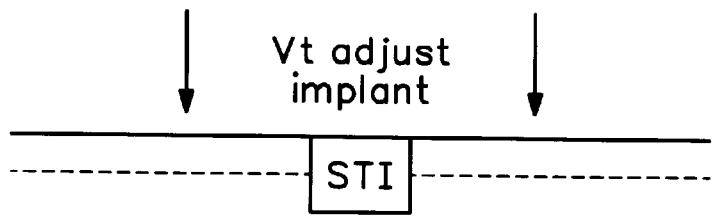
FIGS. 3a through 3c are sequential depictions of a PRIOR ART MOSFET fabrication process showing dual thickness oxide formation steps to achieve dual Vt performance capability.
Figure 3B:
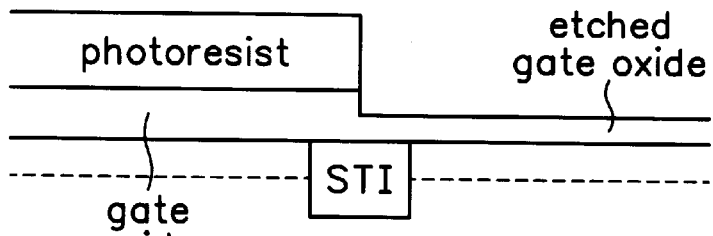
Figure 3C:
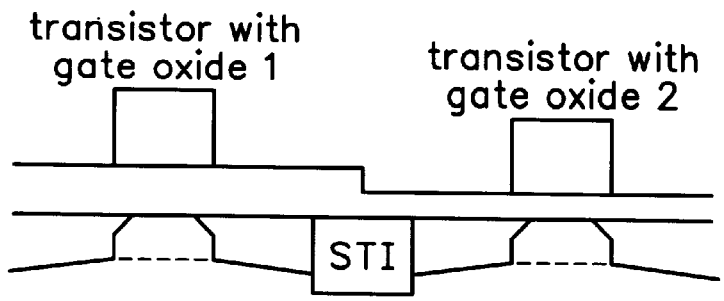
Figure 4A:
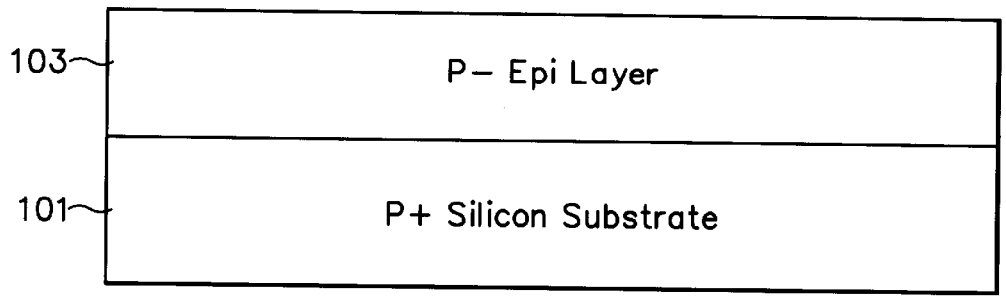
FIGS. 4a through 4i depict a MOSFET fabrication process in accordance with the present invention.

Turning to FIG. 4a, the foundational material for integrated circuit fabrication consists of a commercial silicon substrate 101, doped with a relatively high p-type ion concentration, P+ ($10^{18}/cm^3$). An epitaxial layer 103 consists of silicon having a lighter doping p-type ion concentration, P− ($10^{16}/cm^3$).

Figure 4B:
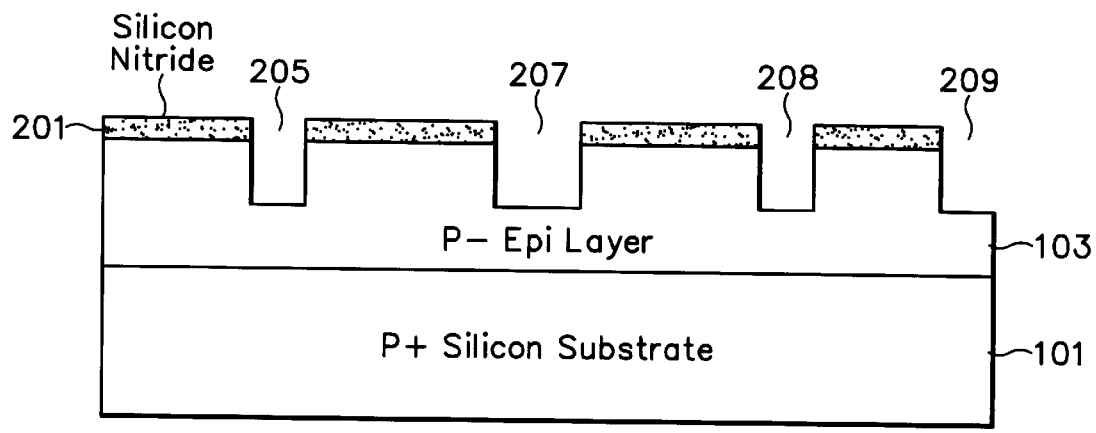

As depicted in FIG. 4b, using a silicon nitride mask 201, trenches 203, 205, 207, 209 et seq., are formed in the epitaxial layer 103. It will be recognized by a person skilled in the art that only a small segment of the surface of one integrated circuit dice, or "chip," being fabricated on a silicon wafer in order to demonstrate the formation in accordance with the present invention of two, adjacent, exemplary MOSFETs having differing Vt characteristics. Multiple devices are simultaneously formed.

Figure 4C:
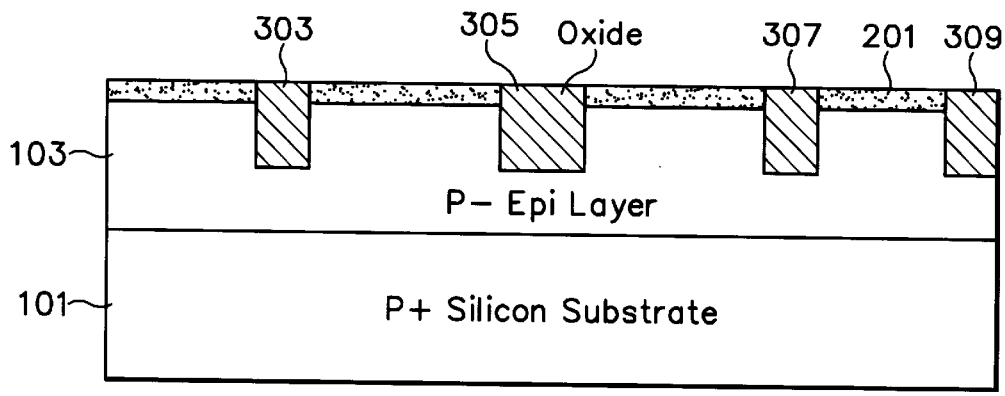

As shown in FIG. 4c, the trenches 203, 205, 207, 209 et seq., are filled with oxide 303, 305, 307, 309 et seq., respectively, by a known manner technique. The filled trenches will provide p-type device/n-type device oxide regions known in the art as "shallow trench isolation" ("STI") regions. [See, e.g., U.S. Pat. Nos. 5,759.871 (Hause et al.) and 5,767,000 (Fulford, Jr. et al.) assigned to the common assignee of the to present, incorporated herein by reference. Local oxidation of silicon, known as the "LOCOS," to form device field oxide, "FOX," isolation regions, and the like processes are also compatible with the present invention.] The silicon nitride mask 201 is stripped and the surface is planarized via a known manner wafer polishing process.

Figure 4D:
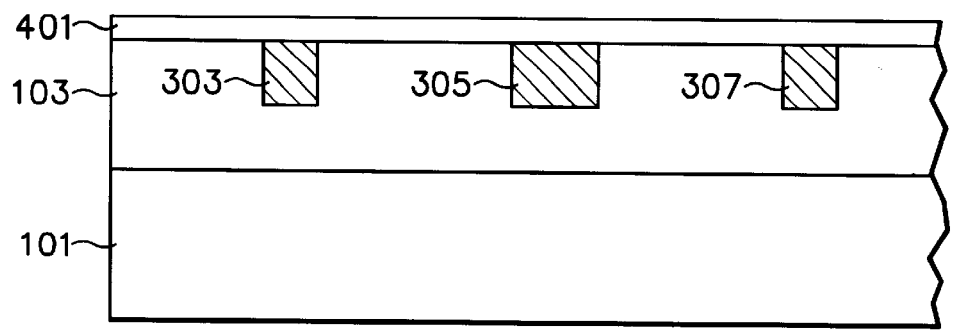

The next step, as shown in FIG. 4d is the formation of the gate oxide layer 401, grown in accordance with known techniques, to form a layer having a thickness in the range of 1.5 to 2.5 nm.

Figure 4E:
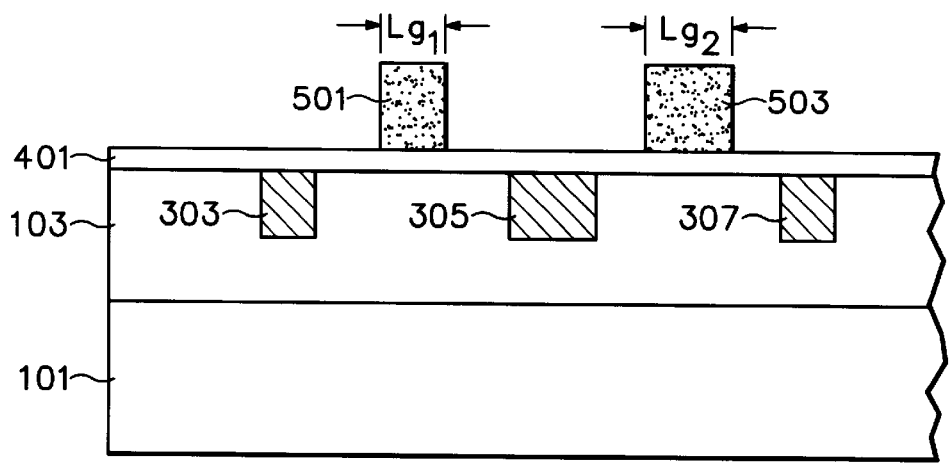

FIG. 4e depicts the next step, the formation of polysilicon, or amorphous silicon, gate pillars 501, 503. While using known fabrication processes, such as conventional photolithographic and trim plasma etching, note that different sizes are intentionally formed. For example, gate pillar 501 is etched to a gate length, "$Lg_1$," of 90 nm, while gate pillar 502 is etched to $Lg_2$=150 nm.

Figure 4F:
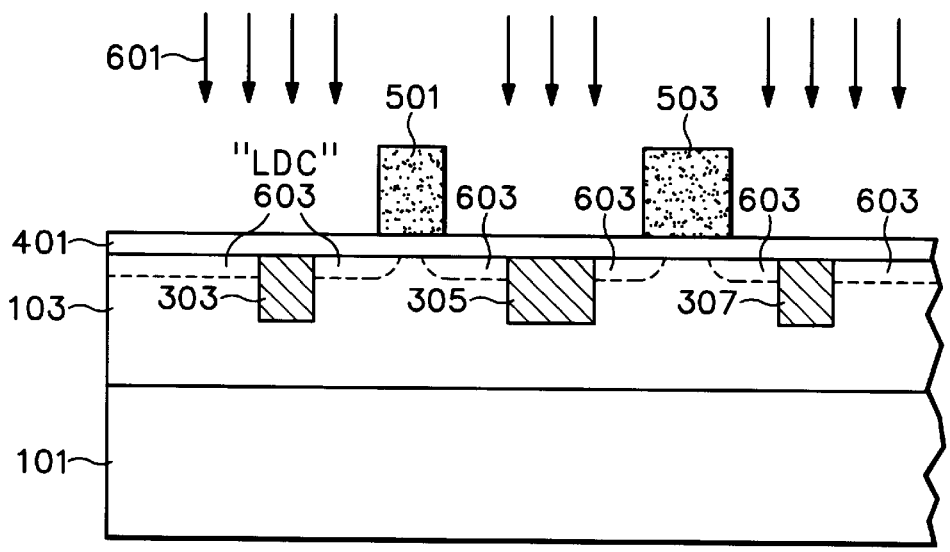

Having gotten to this stage of fabrication without having to add any process steps in order to create dual Vt devices, the structure is ready for impurity implants in order to form dual Vt MOSFET devices. As illustrated in FIG. 4f, using the gate pillars 501, 503 as a self-aligned implant mask, laterally doped channel ("LDC") implant forming regions 603 is made, such as with boron or $BF_2$ as represented by arrows 601. An exemplary process parameter is a dopant implant energy of approximately 10–20 KeV for boron or 45–90 KeV for $BF_2$ at a concentration of about 1.0 to $2.5\times10^{13}$ ions/$cm^2$ using a zero tilt implant angle.

Figure 4G:
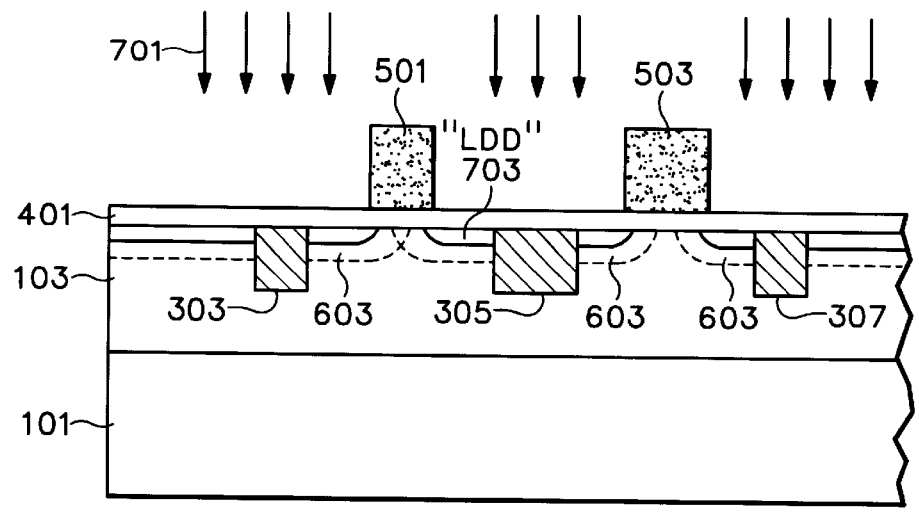

FIG. 4g represents the use of known manner implant oxidation at about 800 to 900 degrees C., to migrate the LDC regions 603. This is followed by an implant, represented by arrows 701, of lightly-doped source/drain ("LDD") regions 703 The LDD implant is made in the exemplary embodiment with arsenic ions at a concentration of about $5\times10^{13}$ to $1.5\times10^{15}$ ions/$cm^2$ at 1-to-5 KeV.

Starting with FIG. 4g, another clear difference between short channel and long channel devices becomes apparent. The longer channel device on the right side of the FIGURE has no overlap in the LDC regions 603. Therefore, the longer channel device has a higher leakage current, $I_{OFF}$. The effect is inversely related to the chosen LDC energy. That is, use of a lower LDC energy increases the effect; with a higher LDC energy the effect is less, but device turn-on current, $I_{ON}$, will be much higher.

Figure 4H:
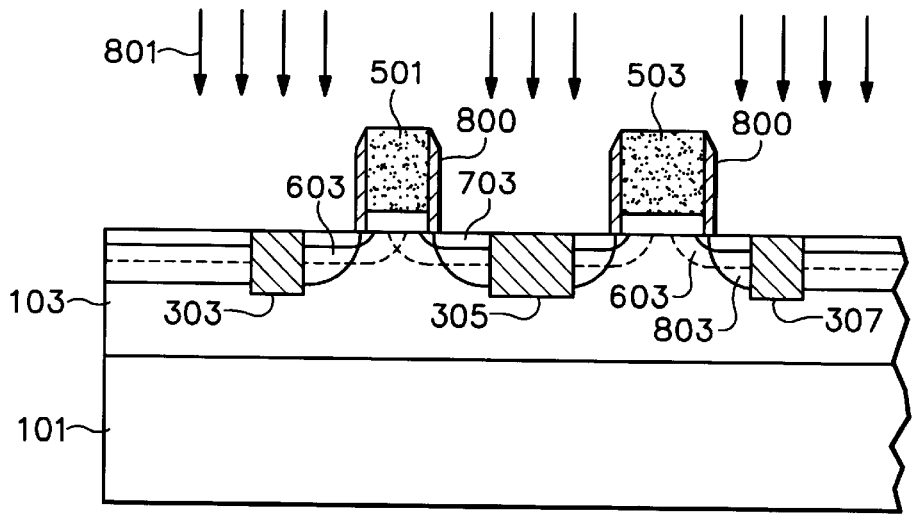

Turning to FIG. 4h, the process proceeds with known manner steps of forming gate sidewall spacers 800, to serve as insulating films for subsequently formed electrodes. In the current exemplary embodiment, the spacers have a width in the range of approximately 50-to-100 nm. Next, highly-doped source/drain implantation, represented by arrows 801, is performed—such as with arsenic at about 10-to-30 KeV and a concentration of approximately 2.0-to-4.0×$10^{15}$ ions/$cm^2$, or with phosphorus at a like concentration at about 5-to-15 KeV—forming source/drain region 803.

Implants are then annealed—such as by using a rapid thermal annealing ("RTA") process at about 1020-to-1050° C. for approximately 10-to-30 seconds—to activate the implanted regions as would be known in the art.

Figure 4I:
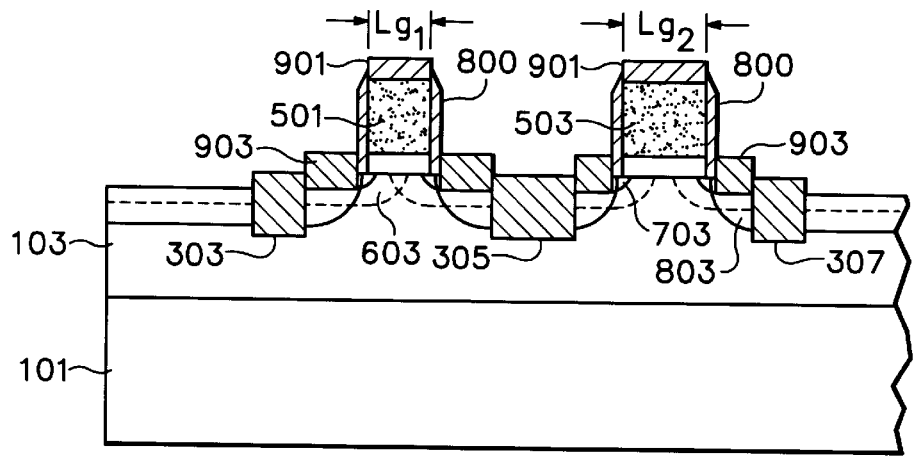

Finally, as shown in FIG. 4i, gate electrodes 901 and source/drain electrodes 903 are formed using known manner salicidation process steps. The fully-formed gate pillars 501, 503 are also referred to in the art as the "gate stack."

Having two gate lengths, namely $Lg_1$ and $Lg_2$, in accordance with this process provides devices having different threshold voltages, Vt. Note that similarly, more than two gate lengths, $Lg_n$, can be formed, resulting in devices of three or more threshold voltages, without multiple Vt adjust implants or formation of different thickness gate oxide layers being required.

The foregoing description of the preferred embodiment of the present invention has been presented for purposes of illustration and description. It is not intended to be exhaustive or to limit the invention to the precise form or to exemplary embodiments disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application, thereby to enable others skilled in the art to understand the invention for various embodiments and with various modifications as are suited to the particular use or implementation contemplated. It is intended that the scope of the invention be defined by the claims appended hereto and their equivalents.

What is claimed is:

1. An integrated circuit fabrication process for making multi-threshold voltage ($Vt_n$) circuit devices, the process comprising:

forming a gate oxide layer on a semiconductor substrate;

forming a plurality of gate pillars intentionally having a plurality of gate length dimensions, $Lg_n$, on said gate oxide layer such that a respective plurality of subjacent channel regions having corresponding channel lengths, $Lc_n$, are formed in said substrate subjacent said gate pillars; and using said gate pillars as a self-aligned mask, forming dopant implant regions in each of said subjacent channel regions and on first and second sides of the channel regions at each of the plurality of gate pillars respectively such that each combination of a dopant implant region, a channel region and a superjacent gate pillar thereof forms a semiconductor device having a characteristic threshold voltage, Vt, determined by a respective channel length thereof, including adjusting LDC (laterally doped channel) dopant implant energy such that LDC regions are formed wherein the dopant implant energy controls leakage current and turn-on current relationship forming relatively short channel length devices having a high threshold voltage.

2. The integrated circuit fabrication process as set forth in claim 1, said step of forming dopant implant regions further comprising the step of:

using said gate pillars as a self-aligned mask, performing an LDC implant at a boron dopant implant energy in a range of approximately 10–20 KeV or a $BF_2$ dopant implant energy in a range of approximately 45–90 KeV at a concentration in a range of about 1.0 to $2.5\times10^{13}$ ions/$cm^2$ using a zero tilt implant angle, wherein an LDC region is formed on said first and second sides of the channel regions.

3. The integrated circuit fabrication process as set forth in claim 2, said step of an LDC implant forming dopant implant regions further comprising the step of:

migrating said LCD region into said substrate and through said channel region by an implant oxidation at a temperature in a range of about 800 to 900 degrees C.

4. The integrated circuit fabrication process as set forth in claim 2, said step of forming dopant implant regions further comprising the step of:

following said step of performing an LDC implant, performing an LDD implant at a concentration of in a range of about $5\times10^{13}$ to $1.5\times10^{15}$ ions/$cm^2$ at an implant energy having a range of about 1-to-5 KeV.

5. The integrated circuit fabrication process as set forth in claim 4, said step of forming dopant implant regions further comprising the step of:

following said step of performing an LDD implant, performing a highly-doped source/drain implantation of arsenic dopant on said first and second side in said substrate at an implant energy having a range of about 10-to-30 KeV and a concentration in a range of approximately $2.0$-to-$4.0 \times 10^{15}$ ions/cm$^2$.

6. The integrated circuit fabrication process as set forth in claim 4, said step of forming dopant implant regions further comprising the step of:

following said step of performing an LDD implant, performing a highly-doped source/drain implantation of phosphorus dopant at a concentration in the range of approximately $2.0$-to-$4.0 \times 10^{15}$ ions/cm$^2$ at an implant energy in a range of about 5-to-15 KeV, forming source/drain regions on said first and second side in said substrate.

7. A method for fabrication of an integrated circuits such that each single integrated circuit has MOSFET devices having differing threshold voltage characteristics, the method comprising:

providing a semiconductor substrate having an epitaxial layer;

forming device isolation regions in said epitaxial layer;

forming a gate oxide layer on the epitaxial layer;

forming a plurality of MOSFET devices by forming a plurality of gate pillars on said gate oxide layer, wherein each of the gate pillars has a characteristic gate length dimension, $Lg_n$, such that a respective plurality of subjacent channel regions having corresponding channel lengths, $Lc_n$, are formed in said substrate subjacent said gate pillars, and wherein n is intentionally greater than or equal to 2, and forming dopant implant regions in said subjacent channel regions and on first and second sides of the channel regions at each of the plurality of gate pillars respectively such that each combination of a source/drain region, a channel region and superjacent gate pillar thereof forms a semiconductor device having a threshold voltage, $Vt_n$, determined by the respective channel length therein, including adjusting LDC (laterally doped channel) dopant implant energy such that LDC regions are formed wherein the dopant implant energy controls leakage current and turn-on current relationship forming relatively short channel length devices having a high threshold voltage such that shorter channel lengths than achieved in known manner lightly doped channel processes are provided.

8. The integrated circuit fabrication process as set forth in claim 7, said step of forming dopant implant regions further comprising the step of:

using said gate pillars as a self-aligned mask, performing an LDC implant at a boron dopant implant energy in a range of approximately 10–20 KeV or a BF$_2$ dopant implant energy in a range of approximately 45–90 KeV at a concentration in a range of about $1.0$ to $2.5 \times 10^{13}$ ions/cm$^2$ using a zero tilt implant angle, wherein an LDC region is formed on said first and second sides of the channel regions.

9. The integrated circuit fabrication process as set forth in claim 8, said step of an LDC implant forming dopant implant regions further comprising the step of:

migrating said LCD region into said substrate and through said channel region by an implant oxidation at a temperature in a range of about 800 to 900 degrees C.

10. The integrated circuit fabrication process as set forth in claim 9, said step of forming dopant implant regions further comprising the step of:

following said step of performing an LDC implant, performing an LDD implant at a concentration of in a range of about $5 \times 10^{13}$ to $1.5 \times 10^{15}$ ions/cm$^2$ at an implant energy having a range of about 1-to-5 KeV.

11. The integrated circuit fabrication process as set forth in claim 10, said step of forming dopant implant regions further comprising the step of:

following said step of performing an LDD implant, performing a highly-doped source/drain implantation of phosphorus dopant at a concentration in the range of approximately $2.0$-to-$4.0 \times 10^{15}$ ions/cm$^2$ at an implant energy in a range of about 5-to-15 KeV, forming source/drain regions on said first and second side in said substrate.

12. The integrated circuit fabrication process as set forth in claim 10, said step of forming dopant implant regions further comprising the step of:

following said step of performing an LDD implant, performing a highly-doped source/drain implantation of arsenic dopant on said first and second side in said substrate at an implant energy having a range of about 10-to-30 KeV and a concentration in a range of approximately $2.0$-to-$4.0 \times 10^{15}$ ions/cm$^2$.

13. An integrated circuit having a plurality of MOSFET devices, each of said MOSFET devices having a characteristic threshold voltage (Vt), said circuit comprising:

a semiconductor substrate;

at least one of a first MOSFET device having a first gate stack including a first gate oxide layer on the semiconductor substrate, a polysilicon or amorphous silicon first gate pillar, having a first gate length dimension, $Lg_1$, and a first gate electrode atop said first gate pillar, and a respective first channel region subjacent said first gate stack having a first channel length, $Lc_1$, in said substrate subjacent said first gate stack, and first dopant implant regions in the first channel region and on first and second sides of the first channel region respectively forming a first MOSFET device having a threshold voltage, $Vt_1$, determined by the respective first channel length therein; and at least one of a second MOSFET device having a second gate stack including a second gate oxide layer on the semiconductor substrate, a polysilicon or amorphous silicon second gate pillar, having a second gate length dimension, $Lg_2$, where $Lg_2$ is greater than $Lg_1$, and a second gate electrode atop said second gate pillar, and a respective second channel region subjacent said second gate stack having a second channel length, $Lc_1$, where $Lc_2$ is greater than $Lc_1$, in said substrate subjacent said second gate stack, and second dopant implant regions in the second channel region and on first and second sides of the second channel region respectively forming a second MOSFET device having a threshold voltage, $Vt_2$, determined by the respective second channel length therein, wherein said first MOSFET device is a high speed MOSFET device and said second MOSFET device is a low power consumption MOSFET device wherein said channel length $LC_2$ is less than a channel length achieved in known manner lightly doped channel processes.

\* \* \* \* \*